United States Patent
Zou et al.

(10) Patent No.: US 11,809,656 B2
(45) Date of Patent: Nov. 7, 2023

(54) ARRAY SUBSTRATE, DRIVING METHOD THEREOF, DISPLAY PANEL AND TOUCH DISPLAY DEVICE

(71) Applicant: Xiamen Tianma Micro-Electronics Co., Ltd., Xiamen (CN)

(72) Inventors: Zongjun Zou, Xiamen (CN); Ying Sun, Xiamen (CN); Yumin Xu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 428 days.

(21) Appl. No.: 17/052,529

(22) PCT Filed: Nov. 18, 2019

(86) PCT No.: PCT/CN2019/119252
§ 371 (c)(1),
(2) Date: Nov. 3, 2020

(87) PCT Pub. No.: WO2021/082097
PCT Pub. Date: May 6, 2021

(65) Prior Publication Data
US 2023/0112516 A1    Apr. 13, 2023

(30) Foreign Application Priority Data

Oct. 31, 2019    (CN) .......................... 201911051041.2

(51) Int. Cl.
*G06F 3/041*    (2006.01)
*G06F 3/044*    (2006.01)
*H01L 27/12*    (2006.01)

(52) U.S. Cl.
CPC ........ *G06F 3/04164* (2019.05); *G06F 3/0412* (2013.01); *G06F 3/0446* (2019.05); *H01L 27/124* (2013.01)

(58) Field of Classification Search
CPC .. G06F 3/04164; G06F 3/0412; G06F 3/0446; H01L 27/124
See application file for complete search history.

(56) References Cited

U.S. PATENT DOCUMENTS

2017/0038886 A1 * 2/2017 Zheng ................... G06F 3/0412
2017/0123529 A1   5/2017 Ho
(Continued)

FOREIGN PATENT DOCUMENTS

CN    104714695 A    6/2015
CN    108234088 A    6/2015
(Continued)

*Primary Examiner* — Adam R. Giesy
(74) *Attorney, Agent, or Firm* — KILPATRICK TOWNSEND & STOCKTON, LLP

(57) ABSTRACT

The array substrate at least includes a plurality of electrode rows, a plurality of switch control lines and a plurality of switch units in a display area; each electrode row corresponds to at least one switch control line, each first electrode corresponds to one switch unit, and each switch unit includes at least one first switch; and in one of the electrode rows: the control terminal of at least one first switch in each switch unit in the one electrode row is connected to the same switch control line, the first poles of the first switches connected to the same switch control line are electrically connected to the first electrodes respectively, and the second poles of the first switches connected to the same switch control line are electrically connected to one another.

20 Claims, 9 Drawing Sheets

(56) References Cited

U.S. PATENT DOCUMENTS

2019/0004355 A1* 1/2019 Zeng .................... G06F 3/0443
2020/0234674 A1* 7/2020 Tominaga ............ G09G 3/2096

FOREIGN PATENT DOCUMENTS

| | | |
|---|---|---|
| CN | 106708344 A | 5/2017 |
| CN | 108711406 A | 10/2018 |
| CN | 105549792 B | 2/2019 |
| CN | 102208966 B | 6/2019 |
| CN | 105278194 B | 6/2019 |

* cited by examiner

ARRAY SUBSTRATE, DRIVING METHOD THEREOF, DISPLAY PANEL AND TOUCH DISPLAY DEVICE

CROSS REFERENCE TO RELATED APPLICATIONS

This application is a national phase entry under 35 U.S.C. § 371 of International Application No. PCT/CN2019/119252, filed on Nov. 18, 2019, which claims priority to Chinese Patent Application No. 201911051041.2 filed with the China National Intellectual Property Administration on Oct. 31, 2019 and entitled "Array Substrate, Driving Method thereof, Display panel and Touch Display Device", the entire content of which is herein incorporated by reference.

FIELD

This disclosure relates to the field of display, in particular to an array substrate, a method for driving the array substrate, a display panel and a touch display device.

BACKGROUND

With the development of science and technology, manufacturing of display panels is becoming mature. More and more display panels are widely used in people's daily life and work, thus bringing great convenience to people's daily life and work. An existing display panel mainly includes a liquid crystal display panel (LCD), an organic light emitting diode panel (OLED), a plasma display panel and the like. In order to enlarge a display area of a display device and beautify the appearance of the display device, increasing the display size and resolution, and reducing the width of bezels and the thickness of a body have become one of the main research and development directions, and accordingly the size of the display panel has become larger and larger.

SUMMARY

In a first aspect, this application provides an array substrate.

The array substrate includes a display area, a non-display area surrounding the display area, a base substrate, a plurality of gate lines extending in a first direction and arranged in a second direction, and a plurality of data lines, extending in the second direction and arranged in the first direction.

The gate lines and the data lines intersect and define a plurality of sub-pixels, the gate lines provide switch control signals for the sub-pixels, and the data lines provide data signals for the sub-pixels.

The array substrate further includes electrode rows extending in the first direction and arranged in the second direction.

The electrode rows each includes a plurality of first electrodes, the first electrodes are in the display area, and orthographic projections of at least two of the sub-pixels on a plane where the base substrate is located fall within an orthographic projection of a corresponding one of the first electrodes on the plane.

The array substrate further includes a plurality of switch control lines, and a plurality of switch units in the display area.

The electrode rows each corresponds to at least one of the switch control lines, the first electrodes each corresponds to a respective one of the switch units, and the switch units each includes at least one first switch.

In one of the electrode rows:
a control terminal of at least one first switch in each of the switch units in the one electrode row is connected to a corresponding one of the switch control lines, first poles of first switches connected to the one switch control line are electrically connected to the first electrodes in the one electrode row respectively, and second poles of the first switches connected to the one switch control line are electrically connected to one another; and
in a display stage, the first electrodes are multiplexed as common electrodes and receive common voltage signals, the one switch control line transmits a first control signal to the first switches connected to the one switch control line, and the first electrodes in the one electrode row electrically connected to the first switches are electrically connected.

In a second aspect, this application provides a method for driving the array substrate in the application, and the method includes a method for driving the array substrate in the display stage.

In the display stage: the first electrodes are multiplexed as the common electrodes and receive the common voltage signals; the gate lines transmit the switch control signals to sub-pixels connected to the gate lines to scan the sub-pixels; the switch control lines each transmits the first control signal to first switches connected to the switch control line; the first switches connected to the switch control line are turned on under control of the first control signal; and first electrodes in an electrode row electrically connected to the first switches are electrically connected, and potentials of the first electrodes in the electrode row are the same.

In a third aspect, this application provides a display panel including the array substrate provided in the application.

In a fourth aspect, this application provides a touch display device including the display panel provided in the application.

Compared with the prior art, the array substrate, the method for driving the array substrate, the display panel and the touch display device provided by this disclosure at least achieve the following beneficial effects.

The switch units correspondingly electrically connected to the first electrodes are introduced to the array substrate in the application, and the control terminal of at least one first switch in each switch unit in one of the electrode row is connected to a corresponding one of the switch control lines. In the display stage, the first electrodes are multiplexed as common electrodes for display and receive common voltage signals, the one switch control line transmits the first control signal to the first switches electrically connected to the switch control line, then the first electrodes in the one electrode row electrically connected to the first switches are electrically connected, potentials of the first electrodes in the same electrode row are the same. That is, common voltages received by the first electrodes in the same electrode row are exactly the same, thus the uneven display phenomenon of the display device due to uneven common voltages is effectively avoided, the problem of display split screen is effectively solved, and the display effect of the array substrate, the display panel and the touch display device is advantageously improved.

Through the following detailed description of exemplary embodiments of the disclosure with reference to the accompanying drawings, other characteristics and advantages of the present disclosure will become clear.

BRIEF DESCRIPTION OF THE DRAWINGS

The accompanying drawings incorporated in the specification and constituting a part of the specification illustrate the embodiments of the present disclosure, and together with the description thereof are used to explain the principle of the present disclosure.

DETAILED DESCRIPTION OF THE EMBODIMENTS

Figure 1:
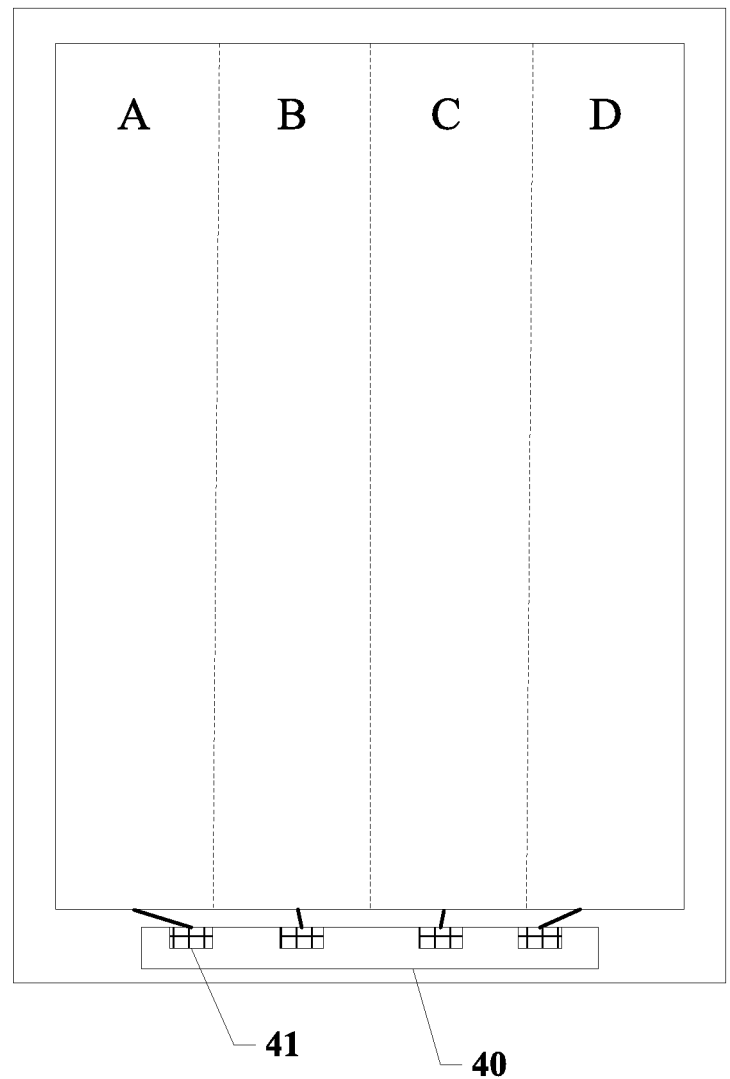
FIG. 1 is a schematic structural diagram of a display panel provided by the prior art.

Various exemplary embodiments of the present disclosure will now be described in detail with reference to the accompanying drawings. It should be noted that unless specifically stated otherwise, the relative arrangement, numerical expressions and numerical values of components and steps set forth in these embodiments do not limit the scope of the present disclosure.

The following description of at least one exemplary embodiment is actually only illustrative, and in no way serves as any limitation on the present disclosure and application or use thereof.

The technologies, methods and equipment in the relevant fields may not be discussed in detail, but where appropriate, the technologies, methods and equipment should be regarded as part of the specification.

In all the examples shown and discussed herein, any specific value should be interpreted as merely exemplary and not as limitative. Therefore, other examples of the exemplary embodiments may have different values.

It should be noted that similar reference numerals and letters indicate similar items in the following drawings, so once an item is defined in one drawing, it does not need to be further discussed in subsequent drawings.

With the rapid development of display technology, in some application fields, such as the field of vehicle-mounted display, display panels are increasingly larger and higher-resolution, which leads to the fact that in the display state, the common voltage of common electrode layers cannot be provided by a single common voltage source. Referring to FIG. 1 which is a schematic structural diagram of a display panel provided by the prior art, in a large-size display panel 400, a driving integrated circuit 40 is usually provided with multiple Vcom OP circuits 41, and the multiple Vcom OP circuits 41 are used to provide common voltage signals for the common electrode layers in different areas to meet the common voltage driving capability requirements under heavier loads. For example, on the display panel, four Vcom OP circuits 41 are introduced to provide common voltage signals for the common electrode layers in a display area A, a display area B, a display area C and a display area D respectively.

However, on the physical level, it is impossible to manufacture two identical Vcom OP circuits 41, as a result, Vcom voltages provided by the different Vcom OP circuits 41 are different when the display panel is overloaded, common voltages in the display areas A, B, C and D are inconsistent in the display state, which leads to a more split-screen phenomenon that can be recognized by the human eyes between the display areas driven by different Vcom OP circuits, the visual effect is affected, and the user experience is greatly reduced.

In view of this, the present disclosure provides an array substrate, a method for driving the array substrate, a display panel and a touch display device which are beneficial to solving the display split screen problem and improving the display effect.

The detailed description will be given below in conjunction with the accompanying drawings and specific embodiments.

Figure 2:
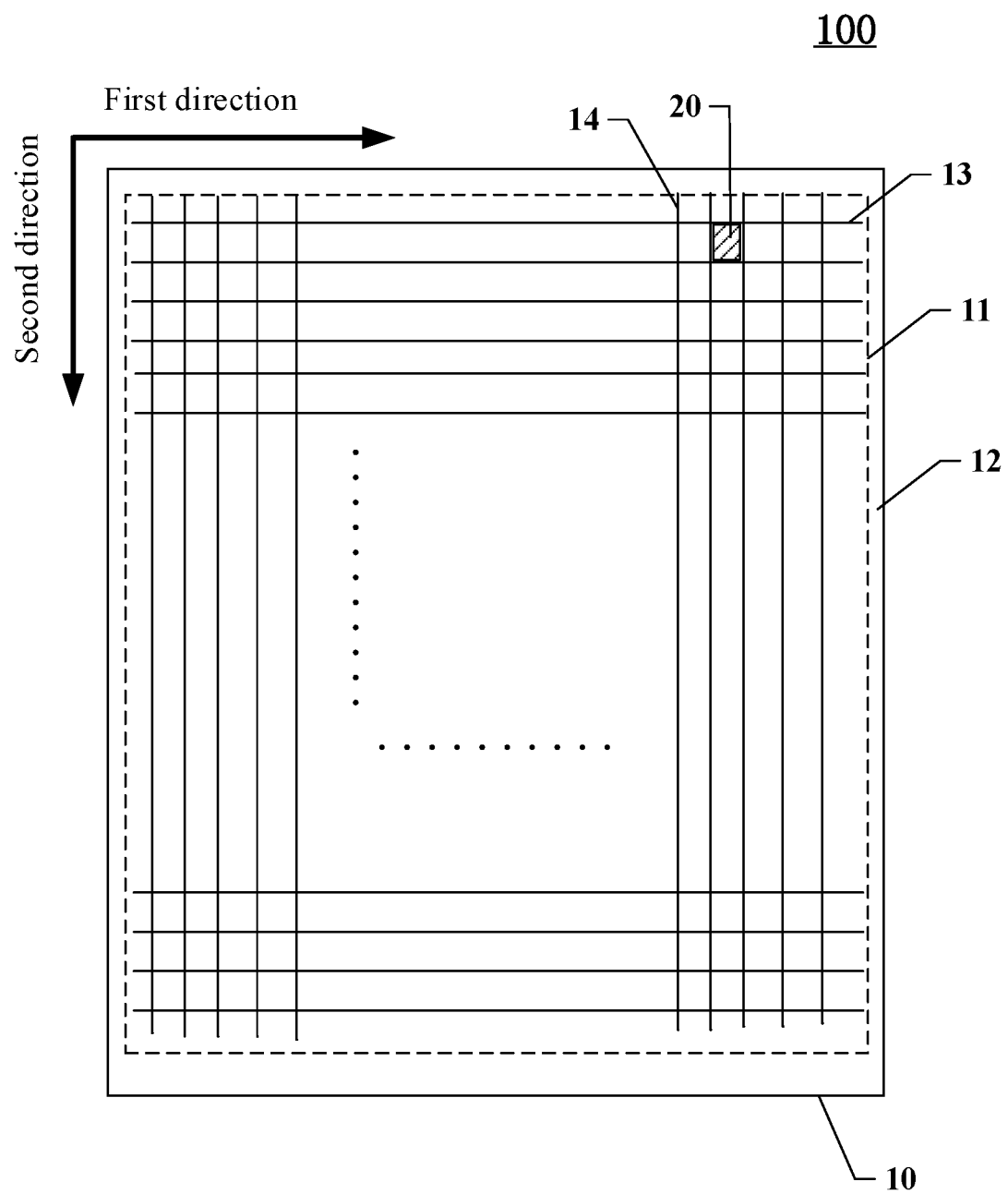
FIG. 2 is a top view of an array substrate provided by an embodiment of the present application.
Figure 3:
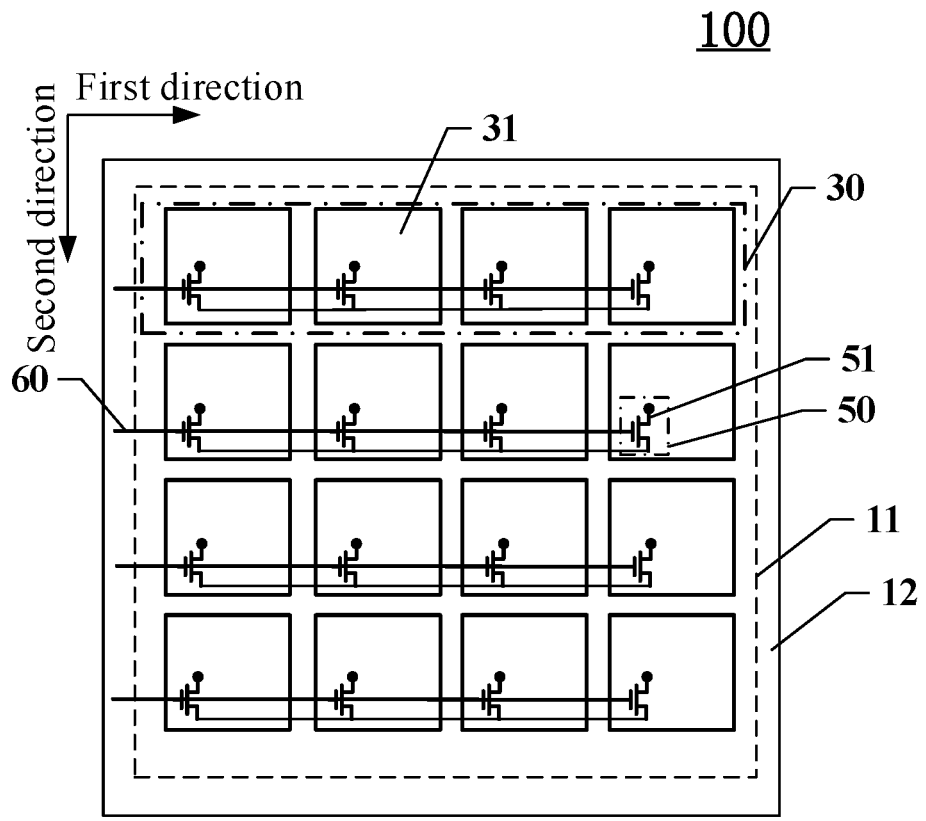
FIG. 3 is another top view of an array substrate provided by an embodiment of the present application.
Figure 4:
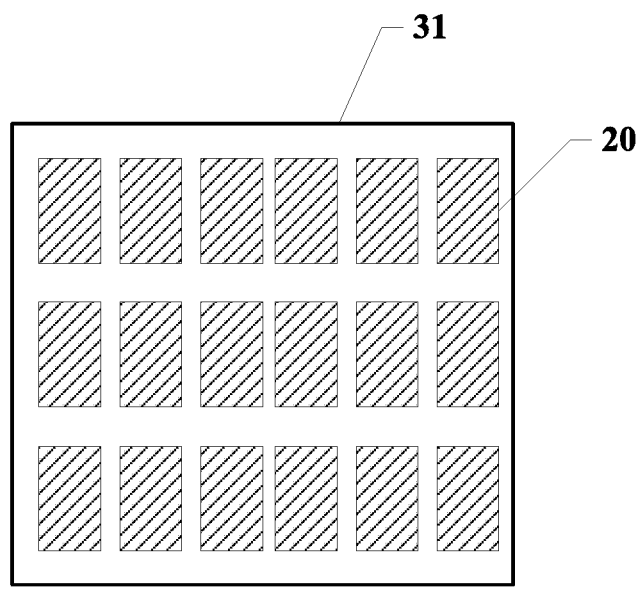
FIG. 4 is a diagram showing a relative positional relationship between a first electrode and sub-pixels provided by an embodiment of the present application.

FIG. 2 is a top view of an array substrate 100 provided by an embodiment of the present application, and the top view shows a relative positional relationship among sub-pixels 20, gate lines 13 and data lines 14. FIG. 3 is another top view of an array substrate 100 provided by an embodiment of the present application, which shows a relative positional relationship among first electrodes 31, switch units 50 and switch control lines 60. FIG. 4 is a diagram showing a relative positional relationship between a first electrode 31 and sub-pixels 20 provided by an embodiment of the present application. Referring to FIG. 2, the array substrate 100 includes: a display area 11 and a non-display area 12 surrounding the display area 11; and the array substrate 100 further includes:

a base substrate 10;

a plurality of gate lines 13, extending in a first direction and arranged in a second direction;

a plurality of data lines 14, extending in the second direction and arranged in the first direction, herein the gate lines 13 and the data lines 14 intersect and define a plurality of sub-pixels 20, the gate lines 13 provide switch control signals for the sub-pixels 20, and the data lines 14 provide data signals for the sub-pixels 20;

electrode rows 30, extending in the first direction and arranged in the second direction, referring to FIGS. 3 and 4, herein each electrode row 30 includes a plurality of first electrodes 31, and the first electrodes 31 are located in the display area 11; and the orthographic projections of at least two of the sub-pixels 20 on a plane where the base substrate 10 is located fall within the orthographic projection of a corresponding one of the first electrodes 31 on the plane;

a plurality of switch control lines 60; and a plurality of switch units 50 in the display area 11, referring to FIG. 3; herein each electrode row 30 corresponds to at least one switch control line 60, each first electrode 31 corresponds to a respective one of the switch units 50, and each switch unit 50 includes at least one first switch 51.

In one of the electrode rows 30:

the control terminal of at least one first switch 51 in each switch unit 50 in the one electrode row is connected to a corresponding one of the switch control lines 60, the first poles of the first switches 51 connected to the one switch control line 60 are electrically connected to the first electrodes 31 in the one electrode row respectively, and the second poles of the first switches 51 connected to the one switch control line 60 are electrically connected to one another; and in the display stage, the first electrode 31 are multiplexed as common electrodes and receive common voltage signals; and the one switch control line 60 transmits a first control signal to the first switches 51 connected to the switch control line 60, so that first electrodes 31 in the one electrode row 30 electrically connected to the first switches 51 are electrically connected.

It should be noted that FIG. 2 only shows a relative positional relationship diagram of the gate lines 13, the data lines 14 and the sub-pixels 20, and does not represent the actual size and quantity. FIG. 3 only shows a relative positional relationship diagram of the first electrodes 31, the switch control lines 60 and the switch units 50, and does not represent the actual size and quantity. In addition, FIG. 3 only takes each switch unit 50 including one first switch 51 as an example for description, and the case where each switch unit 50 includes multiple first switches 51 will be described in detail in the following content. FIG. 4 only shows the case where the orthographic projections of 3×6 sub-pixels 20 on the plane where the base substrate 10 is located fall in the orthographic projection of one first electrode 31 on the plane, that is, the orthographic projection of one first electrode 31 on the plane where the base substrate 10 is located covers the sub-pixels 20 in 3 rows and 6 columns, that is, the number of 18 sub-pixels 20. In some other embodiments of the present application, the orthographic projection of one first electrode 31 on the plane where the base substrate 10 is located can also cover more sub-pixels 20, for example, dozens of rows or even hundreds of rows of sub-pixels 20 may be covered, which is not specifically limited herein.

In one embodiment, referring to FIGS. 2 to 4, in the array substrate 100 provided by the embodiments of the present application, a plurality of first electrodes 31 are distributed in the display area 11. In the display stage, each first electrode 31 is multiplexed as a common electrode and receives a common electrode signal. In particular, a switch unit 50 is introduced to each first electrode 31 in the present application. In the same electrode row 30, in each of the switch units 50 corresponding to the first electrodes 31, the control terminal of at least one of the first switches 51 is connected to the same switch control line 60. Furthermore, the first poles of the first switches 51 connected to the same switch control line 60 are electrically connected to the first electrodes 31 respectively, and the second poles are electrically connected to one another. In the display stage, the same one switch control line 60 transmits a first control signal to the first switches 51 electrically connected to the switch control line 60 in the switch units 50, so that the first switches 51 electrically connected to the switch control line 60 are turned on. The first electrodes 31 in the same one electrode row 30 are electrically connected through the first poles and the second poles of the first switches 51, so that potentials of the first electrodes 31 in the same electrode row 30 are the same, that is, common voltages received by the first electrodes 31 in the same electrode row 30 are completely the same, therefore uneven display of a display device 300 due to inconsistent common voltages is effectively avoided, the display split screen problem is effectively solved, and thus the display effect is advantageously improved. It should be noted that although the first switches 51 introduced into the first electrodes 31 are located in the display area 11 in the present application, the first switches 51 are located in a non-opening area in the display area 11 to avoid affecting normal display.

Figure 5:
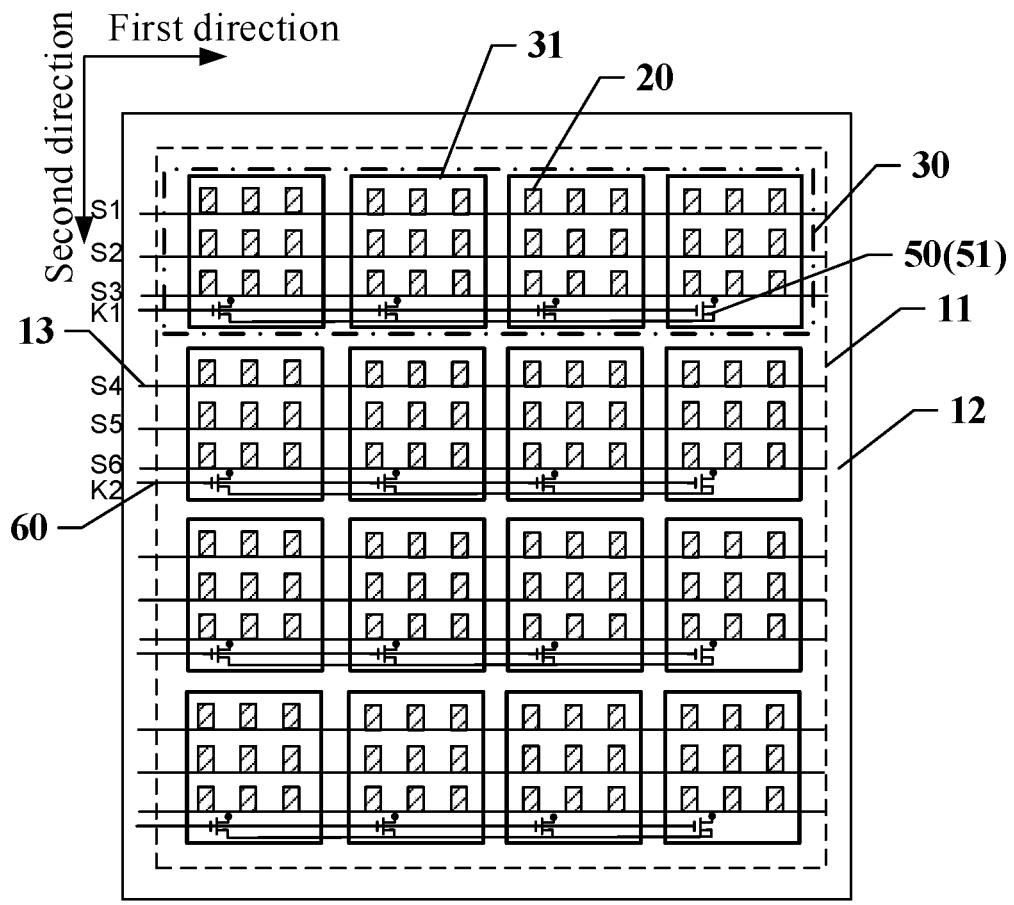
FIG. 5 is another top view of an array substrate provided by an embodiment of the present application.

In one embodiment, FIG. 5 shows another top view of an array substrate 100 provided by an embodiment of the present application. Referring to FIG. 5, each electrode row 30 corresponds to a switch control line 60. The orthographic projections of then rows of sub-pixels 20 on the plane where the base substrate 10 is located overlap with the orthographic projection of one electrode row 30 on the plane where the base substrate 10 is located, and n≥1.

In the display stage, during the scanning of the sub-pixels 20 overlapping with the orthographic projection of the same electrode row 30 on the plane where the base substrate 10 is located, the switch control line 60 corresponding to the electrode row 30 continuously transmits the first control signal to the first switches 51 connected to the switch control line 60. It should be noted that scanning the sub-pixels 20 overlapping with the orthographic projection of the same electrode row 30 on the plane where the base substrate 10 is located herein refers to scanning the sub-pixels 20 in the n rows.

In one embodiment, in FIG. 5, the orthographic projections of the n rows of sub-pixels 20 on the plane where the base substrate 10 is located overlap with the orthographic projection of one electrode row 30 on the plane where the base substrate 10 is located, that is, a plurality of sub-pixels 20 covered by the orthographic projections of the first electrodes 31 in one electrode row 30 on the plane where the base substrate 10 is located are distributed in n sub-pixel rows; and in this embodiment, n=3 is taken as an example for description. In some other embodiments of the present application, the value of n may be larger, which is not specifically limited in the present application.

Referring to FIG. 5 then, one electrode row 30 corresponds to one switch control line 60 and corresponds to three gate lines 13, and all gates of the first switches 51 corresponding to the first electrodes 31 in the electrode row 30 are connected to the switch control line 60. In the display stage, the three gate lines 13 sequentially scan the corresponding sub-pixel rows, so that the three sub-pixel rows are displayed in sequence; and while the three gate lines 13 sequentially scan the sub-pixels 20, the switch control line 60 continuously transmits first control signal(s) to the first switches 51 electrically connected to the switch control line 60, then the first electrodes 31 in the electrode row 30 are electrically connected to one another during the display stage, thus common voltage signals received by the first electrodes 31 in the corresponding electrode row 30 are completely the same during the image display process of the sub-pixel rows, the problem of display split screen caused by different common voltage signals received by the first electrodes 31 in different areas of the same electrode row 30 in the prior art is avoided, which is beneficial to improving the display effect of the display panel.

In addition, FIG. 5 shows that when one electrode row 30 corresponds to one switch control line 60, each switch unit 50 corresponding to each first electrode 31 in the electrode row 30 includes only one first switch 51, and gates of the first switches 51 are all connected to the switch control line 60. In the display stage, the switch control line 60 transmits first control signal(s) to the first switches 51 to turn the first switches 51 on, so that the first electrodes 31 in the corresponding electrode row 30 are electrically connected. The way that one first electrode 31 is electrically connected to one first switch 51 is beneficial to simplifying the circuit structure of the array substrate 100, simplifying the manufacturing process of the array substrate 100, and improving the production efficiency of the array substrate 100.

Figure 6:
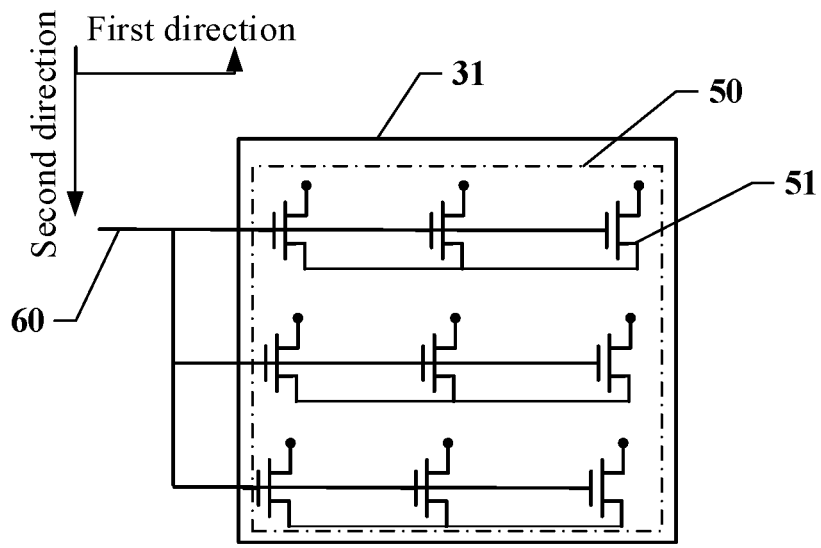
FIG. 6 is a diagram showing a relative positional relationship between a first electrode and a corresponding switch unit in an array substrate provided by an embodiment of the present application.

In one embodiment, to ensure that the introduction of the first switches 51 does not affect the display effect of the display area 11, the first switches 51 may be miniaturized, and further, to ensure the connection reliability between the first electrodes 31 and the first switches 51 and to improve the short-circuit quality of the first electrodes 31 in the same electrode row 30, one switch unit 50 corresponding to one first electrode 31 may also include a plurality of first switches 51, for example, referring to FIG. 6 which is a diagram shows a relative positional relationship between a first electrode 31 and a corresponding switch unit 50 in the array substrate provided by an embodiment of the present application, the case that each switch unit 50 includes a plurality of first switches 51, and each switch unit 50 includes nine first switches 51 is taken as an example for description in the embodiment. In the same switch unit 50, the control terminals of the first switches 51 are connected to the same switch control line 60, the first poles of the first switches 51 are connected to the same first electrode 31, and the second poles of the first switches 51 are electrically connected to one another.

In one embodiment, when each switch unit 50 includes a plurality of first switches 51, each first electrode 31 is electrically connected to the plurality of first switches 51 correspondingly, the second poles of the first switches 51 corresponding to the same first electrode 31 are electrically connected to one another, and gates are electrically connected to the same switch control line 60. In the display stage, the switch control line 60 controls the first switches 51 in each switch unit 50 to be turned on simultaneously, so that the first electrodes 31 in the same electrode row 30 are electrically connected. When one first electrode 31 is electrically connected to a plurality of first switches 51, it is beneficial to improve the reliability of the electrical connection between the first electrode 31 and the switch unit 50, and thus it is beneficial to ensure that the first electrodes 31 located in the same electrode row 30 can be reliably and electrically connected during the display stage. In addition, the plurality of first switches 51 included in the same switch unit 50 can be miniaturized, reducing the influence of the introduction of the first switches 51 on the display effect of the display area.

In one embodiment, referring to FIG. 6, in the same switch unit 50, the first switches 51 are arranged in an array in the first direction and the second direction. Through such design, the first switches 51 within the range defined by the orthographic projection of the first electrode 31 on the plane where the base substrate 10 is located are distributed more evenly, that is, the first switches 51 are more evenly distributed within the range, corresponding to the first electrode 31, of the display area 11, which is beneficial to reducing the influence of the introduction of the first switches 51 on the display effect.

Figure 7:
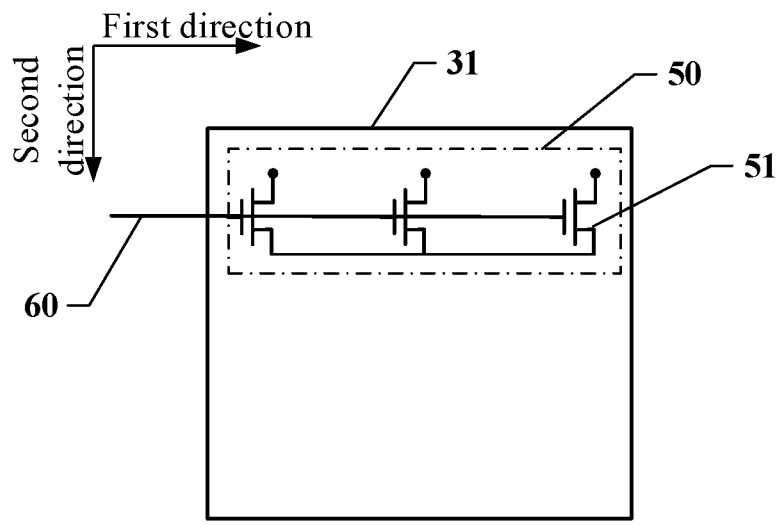
FIG. 7 is a diagram showing another relative position relationship between a first electrode and a corresponding switch unit in an array substrate provided by an embodiment of the present application.

In one embodiment, referring to FIG. 7 which is a diagram shows another relative positional relationship between a first electrode 31 and a corresponding switch unit 50 in the array substrate provided by an embodiment of the present application. First switches 51 in the same switch unit 50 are arranged in the first direction to form a switch row.

In the embodiment shown in FIG. 7, the first switches 51 corresponding to a first electrode 31 are arranged in the same switch row, and the second poles of the first switches 51 may be electrically connected together only through one signal line, therefore, the first switches 51 in the switch unit 50 forms a switch row, then the reliability of the electrical connection between the first switches 51 and the first electrode 31 can be improved to improve the reliability of the electrical connection of the first switches 51 in the same electrode row 30 in the display stage, besides, circuit layout is simple, thus the production process of the array substrate is advantageously simplified, and the production efficiency of the array substrate is favorably improved.

Figure 8:
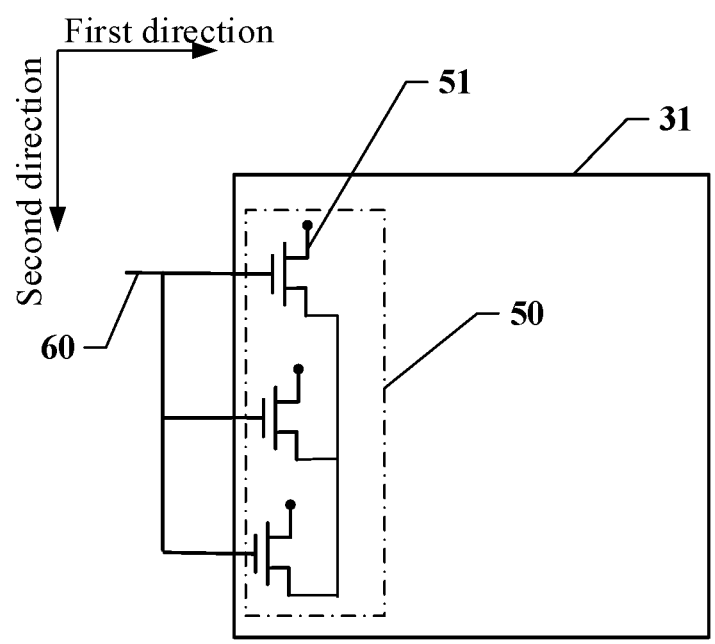
FIG. 8 is a diagram showing another relative positional relationship between a first electrode and a corresponding switch unit in an array substrate provided by an embodiment of the present application.

In one embodiment, referring to FIG. 8 which is a diagram shows another relative position relationship between a first electrode 31 and a corresponding switch unit 50 in the array substrate provided by an embodiment of the present application. The first switches 51 in the same switch unit 50 are arranged in the second direction to form a switch column.

In the embodiment shown in FIG. 8, the first switches 51 corresponding to a first electrode 31 are arranged in the same switch column, the second poles of the first switches 51 may be electrically connected together through one signal line, and gates of the first switches 51 are electrically connected to the same switch control line 60. Therefore, the first switches 51 in each switch unit 50 form a switch column, the reliability of the electrical connection between the first switches 51 and the first electrode 31 can also be improved to improve the reliability of the electrical connection of the first electrodes 31 in the same electrode row 30 in the display stage, the circuit layout is simple, thus the production process of the array substrate is advantageously simplified, and the production efficiency of the array substrate is favorably improved.

Figure 9:
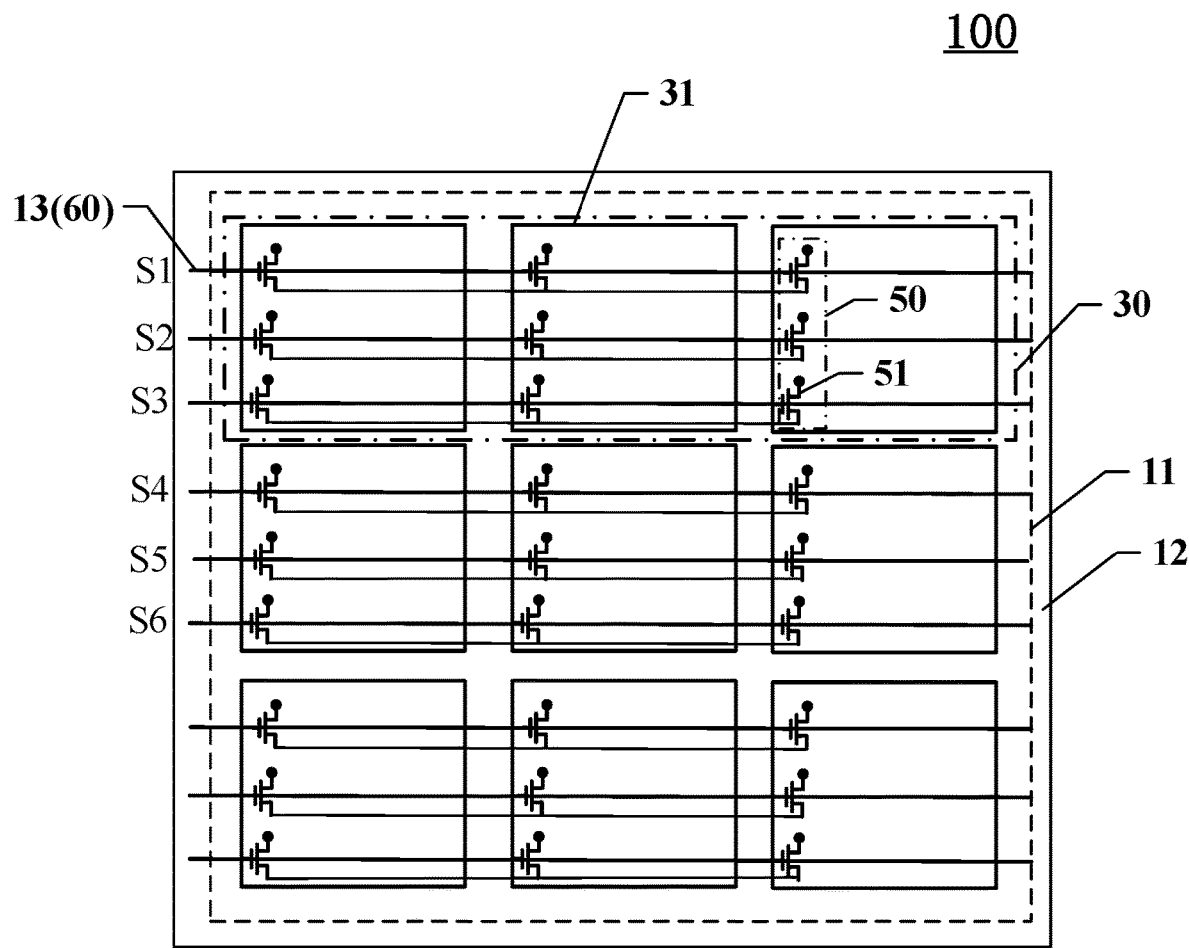
FIG. 9 is another top view of an array substrate provided by an embodiment of the present application.

In one embodiment, FIG. 9 shows another top view of an array substrate 100 provided by an embodiment of the present application. Referring to FIG. 9, the orthographic projections of the n rows of sub-pixels 20 on the plane where the base substrate 10 is located overlap with the orthographic projection of an electrode row 30 on the plane where the base substrate 10 is located, and $n \geq 2$; and each electrode row 30 corresponds to m switch control lines 60, herein m=n; and the gate lines 13 are multiplexed as switch control lines 60.

The embodiment shown in FIG. 9 is described by taking the orthographic projection of one electrode row 30 on the plane where the base substrate 10 is located covering three rows of sub-pixels 20 as an example, that is, n=3. In this way, one electrode row 30 corresponds to three gate lines 13. In the present application, when the gate lines 13 are multiplexed as the switch control lines 60 corresponding to each electrode row 30 respectively, in the display stage, transmitting first control signals to the first switches 51 corresponding to each electrode row 30 through the gate lines 13 can turn on the corresponding first switches 51, so that the first electrodes 31 in the same electrode row 30 are electrically connected. Thus, there is no need to introduce new switch control lines 60 to the array substrate 100, and existing gate lines 13 can be multiplexed as switch control lines 60, and there is no need to introduce a new preparation process separately, which is beneficial to simplifying the production process of the array substrate 100 and improving the production efficiency of the array substrate 100. In addition, when the gate lines 13 are multiplexed as the switch control lines 60, while the gate lines 13 scan the corresponding sub-pixel rows, the first electrodes 31 in the electrode row 30 corresponding to the sub-pixel rows are electrically connected, which is beneficial to ensuring that potentials of the first electrodes 31 in the corresponding electrode row 30 are the same while the sub-pixel rows are scanned and displayed, and received common voltage signals are also the same, therefore, the display split screen phenomenon in the prior art is effectively improved, and the display effect is improved.

In one embodiment, referring to FIG. 9 continuously, the number of first switches 51 included in each switch unit 50 is s, and s≥n; in the same electrode row 30, each gate line 13 is electrically connected to the control terminal of at least one first switch 51 in each switch unit 50.

In one embodiment, FIG. 9 shows a case where s=n, that is, the number of first switches 51 included in each switch unit 50 in an electrode row 30 is the same as the number of rows of sub-pixels corresponding to the electrode row 30, that is, same as the number of switch control lines 60 corresponding to the electrode row 30, which can ensure that each switch control line 60 (namely the gate line 13) can be electrically connected to the first switches 51 corresponding to the first electrodes 31 in the same electrode row 30, the effect that when each gate line 13 scans the sub-pixel rows, the first electrodes 31 in the corresponding electrode row are electrically connected and can receive the same common voltage signal is beneficially ensured, therefore, the reliable electrical connection of the first electrodes 31 in each electrode row 30 in the display stage is advantageously improved, and the display split screen phenomenon is effectively improved.

Figure 10:
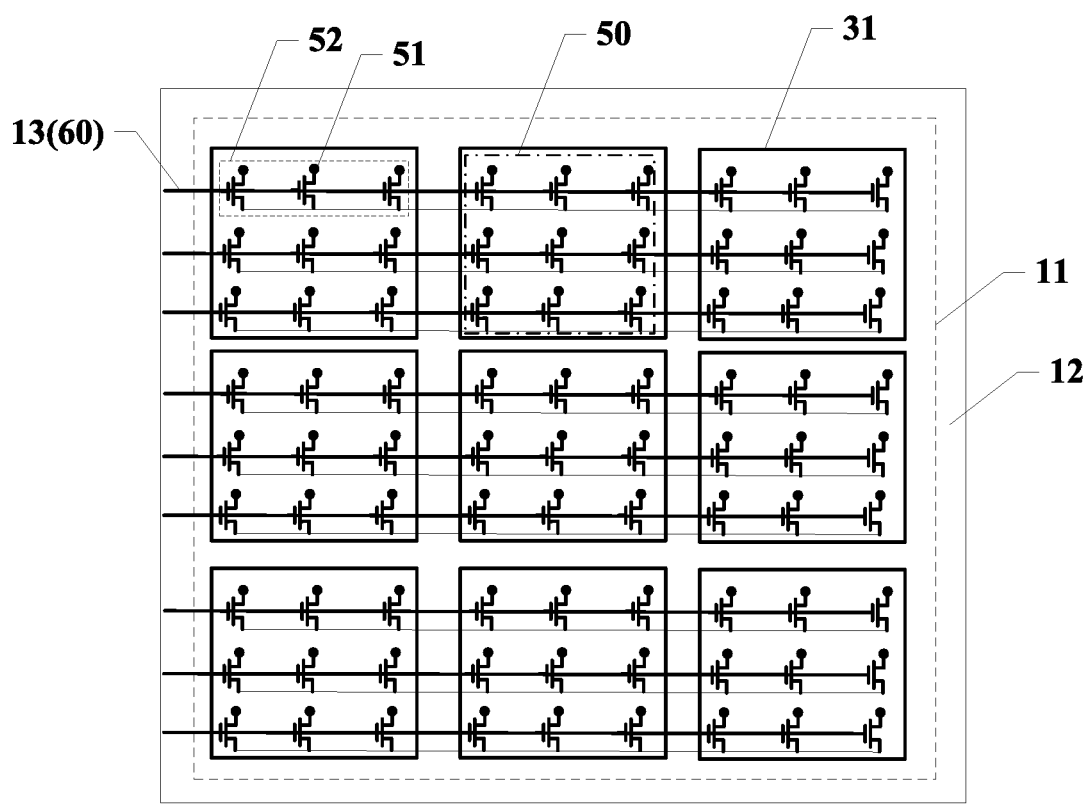
FIG. 10 is another top view of an array substrate provided by an embodiment of the present application.

In one embodiment, FIG. 10 shows another top view of an array substrate 100 provided by an embodiment of the present application. Each switch unit 50 includes a plurality of sub-switch units 52, the number of the sub-switch units 52 is p, and p=n; and each sub-switch unit 52 includes a plurality of first switches 51.

The control terminals of the first switches 51 in the same sub-switch unit 52 are connected to the same switch control line 60, and the first switches 51 in different sub-switch units 52 are connected to different switch control lines 60.

In one embodiment, referring to FIG. 10, in the same electrode row 30, the number p of sub-switch units 52 included in a switch unit 50 corresponding to a first electrode 31 is the same as the number n of switch control lines 60 corresponding to the electrode row 30, which helps to ensure that each switch control line 60 can be electrically connected to a corresponding one of the sub-switch units 52 corresponding to the first electrode 31 in the same electrode row 30, so that when each gate line 13 scans the sub-pixel rows, the first electrodes 31 in the corresponding electrode row 30 are electrically connected and receive the same common voltage signal. In addition, in the same electrode row 30, when each sub-switch unit 52 includes a plurality of first switches 51, and the first switches 51 in each sub-switch unit 52 are electrically connected to the first electrodes 31, the reliability of the electrical connection between the sub-switch units 52 and the first electrodes 31 is beneficially improved, so that the reliability of the electrical connection of the first electrodes 31 in the same electrode row 30 in the display stage is advantageously improved. It should be noted that a case where the number of sub-switch units corresponding to each switch unit is 3 and the number of switch control lines 60 corresponding to each electrode row is also 3 is taken as an example for description in this embodiment, in some embodiments of the present application, the number of sub-switch units can be larger, which is not specifically limited in the present application.

The above-mentioned embodiments provide embodiments in which the first electrodes 31 serve as common electrodes in the display stage. In one embodiment, the array substrate 100 provided by the embodiments of the present application may include touch electrodes and touch signal lines electrically connected to the touch electrodes in a one-to-one correspondence; in the touch stage, the first electrodes 31 are multiplexed as touch electrodes, the first switches 51 are turned off, and the first electrodes 31 are used to receive touch detection signals.

In the touch stage, the first electrodes 31 are multiplexed as touch electrodes to receive touch detection signals in the present application, in this way, there is no need to introduce a new layer structure to the array substrate 100 to manufacture touch electrodes, existing first electrodes 31 are multiplexed as touch electrodes, which is beneficial to simplifying the production process of the array substrate 100 after the touch electrodes are introduced, and the production efficiency of the array substrate 100 is improved.

Based on the same inventive concept, the present application further provides a method for driving the array substrate 100 in the above-mentioned embodiments of the present application, and the method includes a driving method in the display stage.

In the display stage: the first electrodes 31 are multiplexed as common electrodes and receive the common voltage signals; the gate lines 13 transmit the switch control signals to sub-pixels 20 connected to the gate lines 13 to scan the sub-pixels 20; and further, the switch control lines 60 each transmits the first control signal to first switches 51 connected to the switch control line 60, the first switches 51 connected to the switch control line 60 are turned on under the control of the first control signal, and first electrodes 31 in an electrode row 30 electrically connected to the first switches 51 connected to the switch control line are electrically connected, so that potentials of the first electrodes 31 in the electrode row 30 electrically connected to the first switches 51 are the same.

In one embodiment, in the display stage, while the gate lines 13 scan the rows of sub-pixels 20, the switch control lines 60 control the first switches 51 connected to the switch control lines 60 to turn on, then the first electrodes 31 in the corresponding electrode row 30 are electrically connected, so that potentials of the first electrodes 31 in the same electrode row 30 are the same, that is, common voltages received by the first electrodes 31 in the same electrode row 30 are exactly the same, thus the uneven display phenomenon of a display device due to uneven public voltages is effectively avoided, and the problem of display split screen is effectively solved, which is beneficial to improving the display effect.

In one embodiment, referring to FIG. 5, one electrode row 30 corresponds to one switch control line 60, the orthographic projections of n rows of sub-pixels 20 on the plane where the base substrate 10 is located overlap with the orthographic projection of one electrode row 30 on the plane where the base substrate 10 is located, and n≥1.

Figure 11:
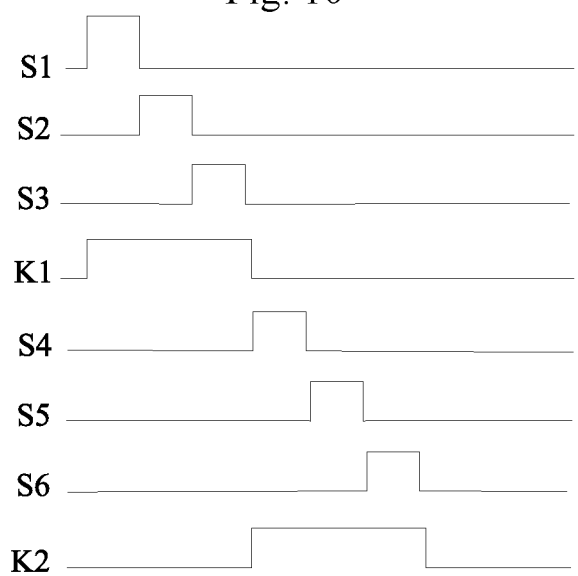
FIG. 11 is a working sequence diagram of an array substrate provided by an embodiment of the present application.

FIG. 11 shows a working sequence diagram of the array substrate 100 provided by an embodiment of the present application. Referring to FIG. 11, in the display stage, while the gate lines 13 scan the sub-pixels 20 that overlap the orthographic projection of the same electrode row 30 on the plane where the base substrate 10 is located, the switch control line 60 corresponding to the electrode row 30 continuously transmits the first control signals to the first switches 51 connected to the switch control line 60.

In one embodiment, the sequence diagram only reflects the working sequence of two adjacent electrode rows 30 and the corresponding six rows of sub-pixels, herein S1 represents a scan signal transmitted to the first row of sub-pixels, S2 represents a scan signal transmitted to the second row of sub-pixels, S3 represents a scan signal transmitted to the third row of sub-pixels, S4 represents a scan signal transmitted to the fourth row of sub-pixels, S5 represents a scan signal transmitted to the fifth row of sub-pixels, S6 represents a scan signal transmitted to the sixth row of sub-pixels, K1 represents a first control signal transmitted to the first switches in the first electrode row, and K2 represents a first control signal transmitted to the first switches in the second electrode row.

In the display stage, scan signals are transmitted to the sub-pixels in the first row, the second row and the third row in sequence, so that the sub-pixels in each row sequentially achieve the display function. During this period, the switch control lines each continuously transmits the first control signal to the first switches 51, thus the first switches are turned on, and the first electrodes 31 in the electrode row 30 are electrically connected to receive the same common voltage signal.

Referring to FIGS. 5 and 11, one electrode row 30 corresponds to one switch control line 60 and corresponds to three gate lines 13, and gates of the first switches 51 corresponding to the first electrodes 31 in the electrode row 30 are connected to the switch control line 60. In the display stage, the three gate lines 13 sequentially scan the corresponding sub-pixel rows, so that the three sub-pixel rows are displayed in sequence; and while the three gate lines 13 sequentially scan the sub-pixels 20, the switch control line 60 continuously transmits the first control signal to the first switches 51 electrically connected to the switch control line 60, then the first electrodes 31 in the corresponding electrode row 30 are electrically connected to one another during the display stage, thus common voltage signals received by the first electrodes 31 in the corresponding electrode row 30 are completely the same during the image display process of the sub-pixel rows, the problem of display split screen caused by different common voltage signals received by the first electrodes 31 in different areas of the same electrode row 30 in the prior art is avoided, which is beneficial to improving the display effect of the display panel 200.

In one embodiment, referring to FIG. 9, the orthographic projections of n rows of sub-pixels 20 on the plane where the base substrate 10 is located overlap with the orthographic projection of one electrode row 30 on the plane where the base substrate 10 is located, and n≥2; each electrode row 30 corresponds to m switch control lines 60, and m=n; and the gate lines 13 are multiplexed as the switch control lines 60.

Figure 12:
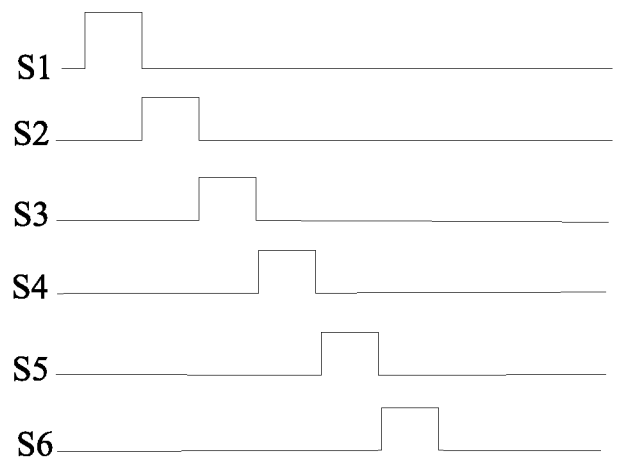
FIG. 12 is another working sequence diagram of an array substrate provided by the embodiment of the present application.

FIG. 12 shows another working sequence diagram of the array substrate 100 provided by an embodiment of the present application. Referring to FIG. 12, in the display stage, gate lines 13 transmit switch control signals to sub-pixels 20 connected to the gate lines 13 and transmit first control signals to first switches 51 connected to the gate lines 13, and the switch control signals and the first control signals are the same signals.

In one embodiment, the working sequence diagram only reflects the working sequence of two adjacent electrode rows 30 and the corresponding six rows of sub-pixels, herein S1 represents a scan signal transmitted to the first row of sub-pixels and also represents a control signal transmitted to the first switches in the first electrode row, S2 represents a scan signal transmitted to the second row of sub-pixels and also represents a control signal transmitted to the first switches in the first electrode row, S3 represents a scan signal transmitted to the third row of sub-pixels and also represents a control signal transmitted to the first switches in the first electrode row, S4 represents a scan signal transmitted to the fourth row of sub-pixels and also represents a control signal transmitted to the first switches in the second electrode row, S5 represents a scan signal transmitted to the fifth row of sub-pixels and also represents a control signal transmitted to the first switches in the second electrode row, and S6 represents a scan signal transmitted to the sixth row of sub-pixels and also represents a control signal transmitted to the first switches in the second electrode row.

Referring to FIGS. 9 and 12. The embodiment shown in FIG. 9 is described by taking the orthographic projection of one electrode row 30 on the plane where the base substrate 10 is located covering three rows of sub-pixels 20 as an example, that is, n=3. In this way, one electrode row 30 corresponds to three gate lines 13. In the present application, when the gate lines 13 are multiplexed as the switch control lines 60 corresponding to each electrode row 30 respectively, in the display stage, transmitting control signals to the first switches 51 corresponding to each electrode row 30 through the gate lines 13 can turn on the corresponding first switches 51, so that the first electrodes 31 in the same electrode row 30 are electrically connected. Thus, there is no need to introduce new switch control lines 60 to the array substrate 100, and existing gate lines 13 can be multiplexed as switch control lines 60, and there is no need to introduce a new preparation process separately, which is beneficial to simplifying the production process of the array substrate 100 and improving the production efficiency of the array substrate 100. In addition, when the gate lines 13 are multiplexed as the switch control lines 60, while the gate lines 13 scan the corresponding sub-pixel rows, the first electrodes 31 in the electrode row 30 corresponding to the sub-pixel rows are electrically connected, which is beneficial to ensuring that potentials of the first electrodes 31 in the corresponding electrode row 30 are the same while the sub-pixel rows are scanned and displayed, and received common voltage signals are also the same, therefore, the display split screen phenomenon in the prior art is effectively improved, and the display effect is improved.

In one embodiment, referring to FIGS. 11 and 12, the method for driving the array substrate 100 in the present application further includes a driving method in the touch stage.

In the touch stage, the first electrodes 31 are multiplexed as touch electrodes, the first switches 51 are turned off, and the first electrodes 31 receive touch detection signals through touch signal lines.

In the touch stage, the first electrodes 31 are multiplexed as touch electrodes to receive touch detection signals in the present application, in this way, there is no need to introduce a new layer structure to the array substrate 100 to manufacture touch electrodes, existing first electrodes 31 are multiplexed as touch electrodes, which is beneficial to simplifying the production process of the array substrate 100 after the touch electrodes are introduced, and the production efficiency of the array substrate 100 is improved.

Figure 13:
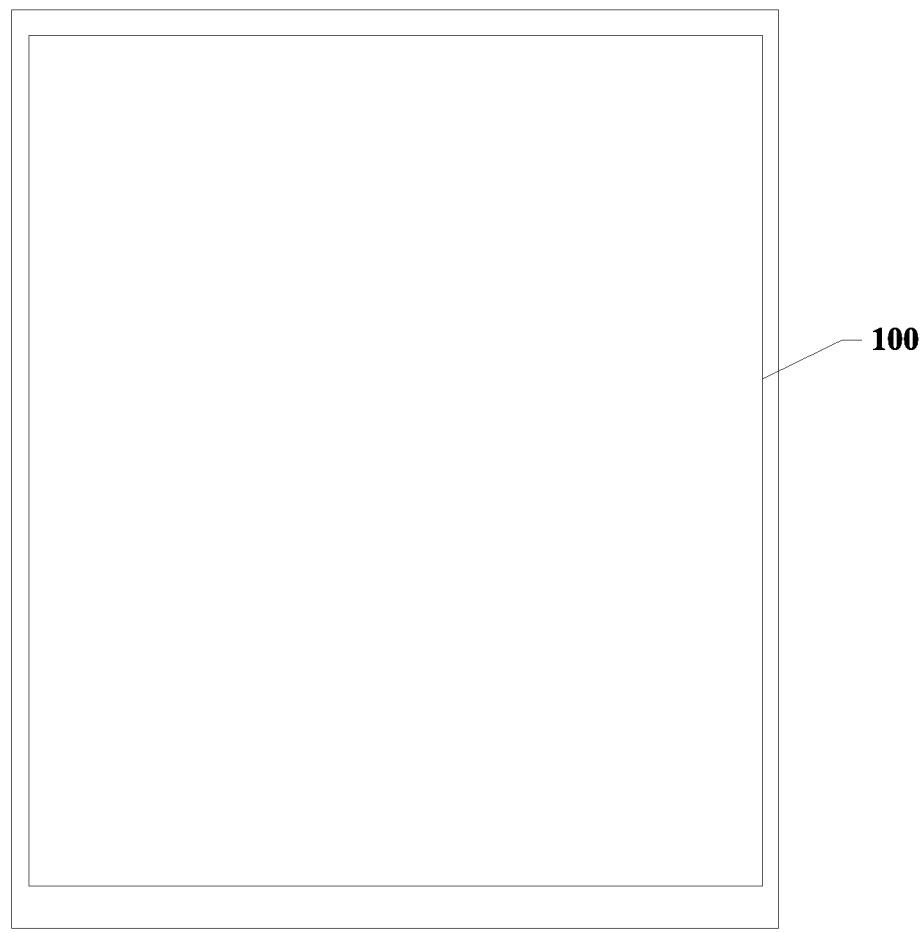
FIG. 13 is a top view of a display panel provided by an embodiment of the present application.

Based on the same inventive concept, the present application further provides a display panel 200. Referring to FIG. 13. FIG. 13 is a top view of the display panel 200 provided by an embodiment of the present application. The display panel 200 includes any array substrate 100 provided in the foregoing embodiments of the present application. Embodiments of the display panel 200 provided in the embodiments of the present application may refer to the embodiments of the above-mentioned array substrate 100, and the repeated parts are not described in detail herein.

Figure 14:
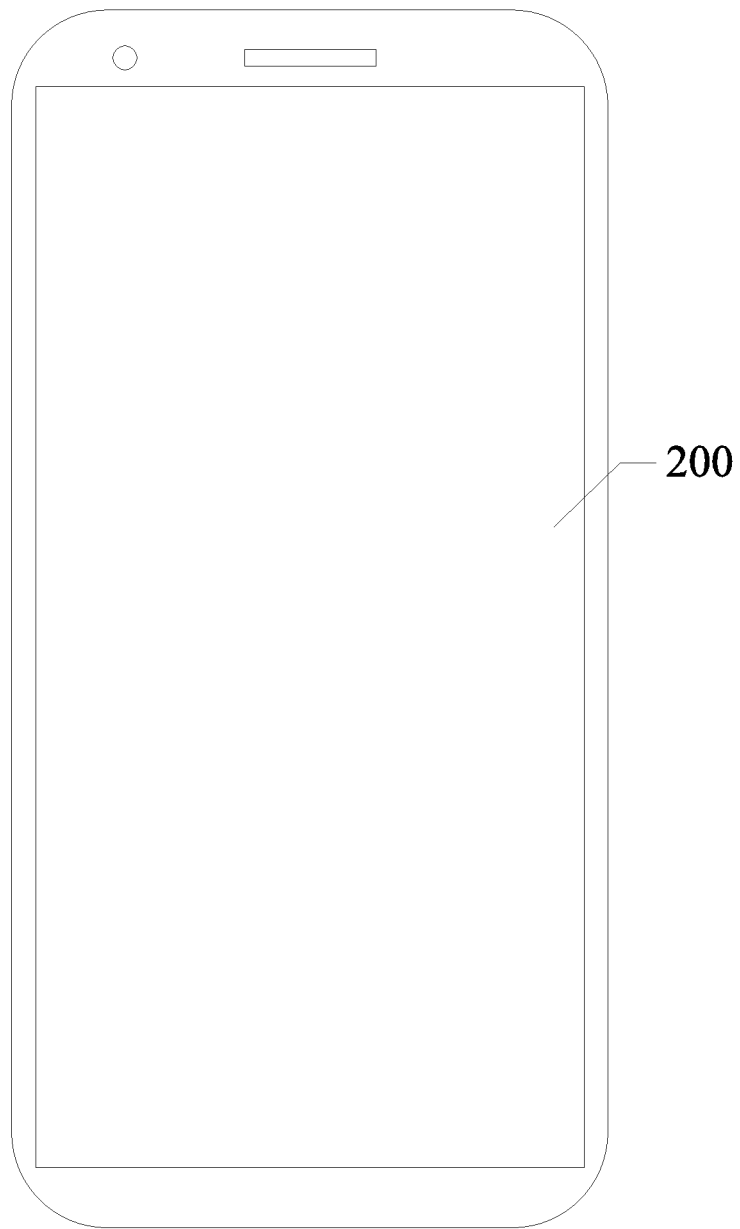
FIG. 14 is a schematic structural diagram of a display device provided by an embodiment of the present application.

Based on the same inventive concept, the present application further provides a touch display device 300. Referring to FIG. 14 which is a schematic structural diagram of the touch display device 300 provided by an embodiment of the present application. The touch display device 300 includes the display panel 200 provided by the embodiment of the present application. Embodiments of the touch display device 300 provided in the embodiment of the present application may refer to the embodiments of the above-mentioned array substrate 100, and the repeated parts are not described in detail herein. The touch display device 300 provided in the present application may be any product or component with a display function such as a mobile phone, a tablet computer, a television, a monitor, a notebook computer and a digital photo frame.

It should be noted that the touch display device 300 provided in the present application can be used in the field of vehicle display in addition to the above-mentioned products or components with the display function, for example, can be used as a vehicle navigator or other vehicle display screens.

It can be seen from the foregoing embodiments that the array substrate, the driving method thereof, the display panel and the touch display device which are provided by the present disclosure at least achieve the following beneficial effects.

The switch units electrically and correspondingly connected to the first electrodes are introduced to the array substrate in the present application, and the control terminal of at least one first switch in each switch unit in the same electrode row is connected to the same switch control line. In the display stage, the first electrodes are multiplexed as common electrodes for receiving common voltage signals, further, the switch control lines each transmits the first control signal to the first switches electrically connected to the switch control line, then the first electrodes in the electrode row electrically connected to the first switches are electrically connected, thus potentials of the first electrodes in the same electrode row are the same, that is, common voltages received by the first electrodes in the same electrode row are exactly the same, thus the uneven display phenomenon of the display device due to uneven common voltages is effectively avoided, the problem of display split screen is effectively solved, and the display effect of the array substrate, the display panel and the touch display device is advantageously improved.

What is claimed is:

1. An array substrate, comprising:
    a display area;
    a non-display area surrounding the display area;
    a base substrate;
    a plurality of gate lines, extending in a first direction and arranged in a second direction;
    a plurality of data lines, extending in the second direction and arranged in the first direction; wherein the gate lines and the data lines intersect and define a plurality of sub-pixels, the gate lines provide switch control signals for the sub-pixels, and the data lines provide data signals for the sub-pixels;
    electrode rows, extending in the first direction and arranged in the second direction; wherein the electrode rows each comprises a plurality of first electrodes, the first electrodes are in the display area, and orthographic projections of at least two of the sub-pixels on a plane, where the base substrate is located, fall within an orthographic projection of a corresponding one of the first electrodes on the plane;
    a plurality of switch control lines; and
    a plurality of switch units in the display area; wherein the electrode rows each corresponds to at least one of the switch control lines, the first electrodes each corresponds to a respective one of the switch units, and the switch units each comprises at least one first switch;
    wherein in one of the electrode rows:
    a control terminal of at least one first switch in each of the switch units in the one electrode row is connected to a corresponding one of the switch control lines, first poles of first switches connected to the one switch control line are electrically connected to the first electrodes in the one electrode row respectively, and second poles of the first switches connected to the one switch control line are electrically connected to one another; and
    in a display stage, the first electrodes are multiplexed as common electrodes and receive common voltage signals, the one switch control line transmits a first control signal to the first switches connected to the one switch control line, and the first electrodes in the one electrode row electrically connected to the first switches are electrically connected.

2. The array substrate according to claim 1, wherein:
    the electrode rows each corresponds to a respective one of the switch control lines;
    orthographic projections of n rows of the sub-pixels on the plane overlap with an orthographic projection of a corresponding one of the electrode rows on the plane, and n≥1; and
    in the display stage, during scanning of the sub-pixels overlapping with the orthographic projection of the one electrode row on the plane, the one switch control line corresponding to the one electrode row continuously transmits the first control signal to the first switches connected to the one switch control line.

3. The array substrate according to claim 2, wherein:
    the switch units each comprises a plurality of first switches; and
    in one of the switch units, control terminals of the first switches in the one switch unit are connected to one of the switch control lines, first poles of the first switches in the one switch unit are connected to one of the first electrodes, and second poles of the first switches in the one switch unit are electrically connected to one another.

4. The array substrate according to claim 3, wherein the first switches in the one switch unit are arranged in an array in the first direction and the second direction.

5. The array substrate according to claim 3, wherein the first switches in the one switch unit are arranged in the first direction to form a switch row.

6. The array substrate according to claim 3, wherein the first switches in the one switch unit are arranged in the second direction to form a switch column.

7. The array substrate according to claim 1, wherein:
orthographic projections of n rows of the sub-pixels on the plane overlap with an orthographic projection of a corresponding one of the electrode rows on the plane, and n≥2;
the electrode rows each corresponds to m switch control lines, and m=n; and
the gate lines are multiplexed as the switch control lines.

8. The array substrate according to claim 7, wherein:
s first switches are comprised in each of the switch units, and s≥n; and
in one of the electrode rows, the control terminal of at least one first switch in each of the switch units in the one electrode row is connected to a corresponding one of the gate lines.

9. The array substrate according to claim 8, wherein:
the switch units each comprises a plurality of sub-switch units, a number of the sub-switch units is p, and p=n; and the sub-switch units each comprises a plurality of first switches; and
control terminals of first switches in one of the sub-switch units are connected to a corresponding one of the switch control lines, and first switches in different sub-switch units are connected to different switch control lines.

10. The array substrate according to claim 1, further comprising:
touch electrodes; and
touch signal lines electrically connected to the touch electrodes in a one-to-one correspondence;
wherein in a touch stage, the first electrodes are multiplexed as the touch electrodes, the first switches are turned off, and the first electrodes receive touch detection signals.

11. A method for driving the array substrate according to claim 1, comprising a method for driving the array substrate in the display stage, wherein, in the display stage:
the first electrodes are multiplexed as the common electrodes and receive the common voltage signals;
the gate lines transmit the switch control signals to sub-pixels connected to the gate lines to scan the sub-pixels;
the switch control lines each transmits the first control signal to first switches connected to the switch control line;
the first switches connected to the switch control line are turned on under control of the first control signal; and
first electrodes in an electrode row electrically connected to the first switches are electrically connected, and potentials of the first electrodes in the electrode row are the same.

12. The method for driving the array substrate according to claim 11, wherein:
the electrode rows each corresponds to a respective one of the switch control lines;
orthographic projections of n rows of the sub-pixels on the plane overlap with an orthographic projection of a corresponding one of the electrode rows on the plane, and n 1; and
in the display stage, during scanning of the sub-pixels overlapping with the orthographic projection of the one electrode row on the plane by the gate lines, the one switch control line corresponding to the one electrode row continuously transmits the first control signal to the first switches connected to the one switch control line.

13. The method for driving the array substrate according to claim 11, wherein:
orthographic projections of n rows of the sub-pixels on the plane overlap with an orthographic projection of a corresponding one of the electrode rows on the plane, and n≥2;
the electrode rows each corresponds to m switch control lines, and m=n;
the gate lines are multiplexed as the switch control lines; and
in the display stage, the gate lines transmit the switch control signals to the sub-pixels connected to the gate lines and transmit the first control signals to the first switches connected to the gate lines; wherein the switch control signals and the first control signals are the same signals.

14. The method for driving the array substrate according to claim 11, further comprising a method for driving the array substrate in a touch stage, wherein:
in the touch stage, the first electrodes are multiplexed as touch electrodes, the first switches are turned off, and the first electrodes receive touch detection signals through touch signal lines.

15. A display panel comprising an array substrate, wherein the array substrate comprises:
a display area;
a non-display area surrounding the display area;
a base substrate;
a plurality of gate lines, extending in a first direction and arranged in a second direction;
a plurality of data lines, extending in the second direction and arranged in the first direction; wherein the gate lines and the data lines intersect and define a plurality of sub-pixels, the gate lines provide switch control signals for the sub-pixels, and the data lines provide data signals for the sub-pixels;
electrode rows, extending in the first direction and arranged in the second direction; wherein the electrode rows each comprises a plurality of first electrodes, the first electrodes are in the display area, and orthographic projections of at least two of the sub-pixels on a plane, where the base substrate is located, fall within an orthographic projection of a corresponding one of the first electrodes on the plane;
a plurality of switch control lines; and
a plurality of switch units in the display area; wherein the electrode rows each corresponds to at least one of the switch control lines, the first electrodes each corresponds to a respective one of the switch units, and the switch units each comprises at least one first switch;
wherein in one of the electrode rows:
a control terminal of at least one first switch in each of the switch units in the one electrode row is connected to a corresponding one of the switch control lines, first poles of first switches connected to the one switch control line are electrically connected to the first electrodes in the one electrode row respectively, and second poles of the first switches connected to the one switch control line are electrically connected to one another; and
in a display stage, the first electrodes are multiplexed as common electrodes and receive common voltage signals, the one switch control line transmits a first control signal to the first switches connected to the one switch control line, and the first electrodes in the one electrode row electrically connected to the first switches are electrically connected.

16. The display panel according to claim 15, wherein:

the electrode rows each corresponds to a respective one of the switch control lines;

orthographic projections of n rows of the sub-pixels on the plane overlap with an orthographic projection of a corresponding one of the electrode rows on the plane, and n 1; and in the display stage, during scanning of the sub-pixels overlapping with the orthographic projection of the one electrode row on the plane, the one switch control line corresponding to one electrode row continuously transmits the first control signal to the first switches connected to the one switch control line.

17. The display panel according to claim 16, wherein:

the switch units each comprises a plurality of first switches; and in one of the switch units, control terminals of the first switches in the one switch unit are connected to one of the switch control lines, first poles of the first switches in the one switch unit are connected to one of the first electrodes, and second poles of the first switches in the one switch unit are electrically connected to one another.

18. The display panel according to claim 15, wherein:

orthographic projections of n rows of the sub-pixels on the plane overlap with an orthographic projection of a corresponding one of the electrode rows on the plane, and n≥2;

the electrode rows each corresponds to m switch control lines, and m=n; and the gate lines are multiplexed as the switch control lines.

19. The display panel according to claim 15, further comprising:

touch electrodes; and touch signal lines electrically connected to the touch electrodes in a one-to-one correspondence;

wherein in a touch stage, the first electrodes are multiplexed as the touch electrodes, the first switches are turned off, and the first electrodes receive touch detection signals.

20. A touch display device, comprising the display panel according to claim 15.

\* \* \* \* \*